United States Patent [19]

Barajas

[11] Patent Number: 4,680,141

[45] Date of Patent: Jul. 14, 1987

[54] SOLDER COMPOSITION

[75] Inventor: Felix Barajas, Huntington Beach, Calif.

[73] Assignee: McDonnell Douglas Corporation, Long Beach, Calif.

[21] Appl. No.: 676,199

[22] Filed: Nov. 29, 1984

[51] Int. Cl.$^4$ .............................................. H01B 1/06
[52] U.S. Cl. .................................. 252/512; 252/514; 252/500
[58] Field of Search ............................. 252/512, 514; 148/23–24; 106/1.05, 1.18, 1.19

[56] References Cited

U.S. PATENT DOCUMENTS

| | | | |
|---|---|---|---|
| 4,391,742 | 7/1983 | Steigerwald et al. | 252/512 |
| 4,535,012 | 8/1985 | Martin et al. | 252/514 |
| 4,595,604 | 6/1986 | Martin et al. | 252/514 |
| 4,595,605 | 6/1986 | Martin et al. | 252/512 |
| 4,595,606 | 6/1986 | Martin et al. | 252/512 |

*Primary Examiner*—Josephine L. Barr
*Attorney, Agent, or Firm*—Max Geldin

[57] ABSTRACT

A test assembly for testing a high density circuit or a test board, which comprises a test head containing a mirror image circuit of the circuit to be tested on the test board, a plurality of test points on the test head circuit, the test points comprising a plurality of metal pads, and metal contacts soldered to the metal pads, the metal contacts being in the form of metal balls or flakes selected from the group consisting of brass, bronze or copper, of a size ranging from about 5 to about 30 mils. The test head is positiioned over the test board with the metal contacts on the test head in contact with corresponding test points on the high density circuit on the test board. Means are provided for connecting the circuit on the test head with a tester, thereby providing signals from the high density circuit under test through the test head circuit to the tester. A solder composition is provided which is especially adapted for soldering the metal contacts to the metal pads on the test head. Such solder composition comprises a liquid vehicle, finely divided solder metal dispersed in the vehicle, the solder metal having a particle size ranging from 40 to 70 microns, and additional metal particles dispersed in the vehicle, the additional particles being in the form of metal balls or flakes selected from the group consisting of brass, bronze and copper, the additional metal particles having a size ranging from about 5 to about 30 mils and being present in an amount ranging from about 5 to about 60% by weight of the total composition.

11 Claims, 4 Drawing Figures

FIG. 2
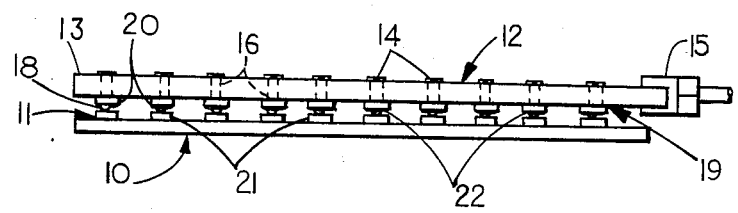
FIG. 3
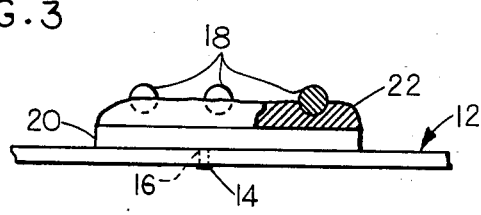
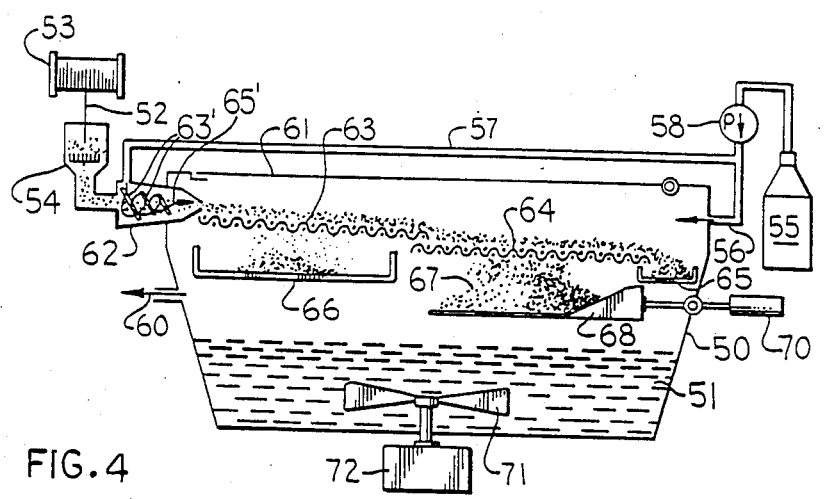
FIG. 4

SOLDER COMPOSITION

BACKGROUND OF THE INVENTION

This invention relates to novel solder compositions or solder creams, and is particularly concerned with the provision of solder compositions especially adapted for testing high density multilayer thick film circuits and high density printed circuit boards, and to a novel system or assembly for testing such circuits utilizing such solder compositions.

Complex high density electronic circuits require testing before electronic components are incorporated into such circuits. These are called bare board circuits. Such circuits can be multilayer circuits comprising layers of conductors terminating at a point on which electronic components are to be placed. To make certain that proper electrical connections exist to each of these points, a testing system termed "bare board testing" is presently in use. In this method, holes are drilled in a circuit pattern on a test head, which is a mirror image of the pattern of the circuit to be tested, and spring loaded probes or contacts which resemble nails are positioned in the holes. Each of such nails makes contact with a connector in the test head circuit which in turn connects to a computer. This test head is known in the practice as a "bed of nails."

The "bed of nails" test head is then placed over the circuit to be tested, with each of the nails or probes on the test head in contact with each of the corresponding points of the circuit being tested on the board.

Each circuit configuration to be tested requires a different test head assembly corresponding to such circuit configuration and the cost of preparing these "bed of nails" test heads for each circuit configuration is very high.

It is accordingly one object of the present invention to provide a system for testing electronic circuits before placing electronic components thereon to ensure that all of the electrical interconnections are properly in place.

Another object is the testing of high density electronic circuits while avoiding the use of spring loaded probes or "the bed of nails" test heads presently employed in the prior art.

A further object of the invention is the provision of a novel solder composition for use in conjunction with a circuit pattern on a test head and wherein the solder composition is designed to provide the contact points between the test points of the electrical connections on the test head and the test points of the electrical connections of the corresponding circuit under test.

Yet another object of the invention is to provide a novel test head arrangement for testing high density circuits for continuity and isolation prior to assembly thereof.

SUMMARY OF THE INVENTION

According to the present invention, a relatively inexpensive support or membrane forming a test head is provided having thereon an electronic circuit which is a mirror image of the circuit which is to be undergoing test. This test head, preferably in the form of a translucent membrane, is provided with a plurality of contacts in the form, for example, of brass balls, which are secured to the membrane or test head by means of a fused solder composition. The metal, e.g., brass balls, which are held in place on the test head by the fused solder composition, are connected to contact or test points in the form of pads on the test head circuit. Such test points are interconnected with conductors on the test head circuit which are electrically connected to a tester or computer for testing a corresponding high density circuit to ensure proper electrical connections at corresponding test points on the latter circuit.

For this purpose, the probe or test head containing the contacts in the form of the multiplicity of metal, e.g., brass balls is placed over the high density circuit on the test board which is undergoing test, with the metal balls or conductors contacting the test points of the circuit on the test head. Thus, the metal balls provide the contact point between the probe or test head circuit and the circuit on the test board. The balls which are fused to the test head by the solder composition and which form the contacts between the respective test points of the circuit on the test head and the circuit on the test board to be tested, replaces the complex and highly expensive "bed of nails" test head heretofore employed in practice for testing particularly high density multilayer thick film substrate circuitry for continuity and isolation prior to assembly.

For mounting the metal balls forming the contact points on the test head, copper, brass or bronze particles, e.g., spheres, having a size, e.g., about 10 mils, and substantially larger than the conventional solder metals employed in solder compositions, are added to a solder composition or solder cream. Such spheres can be added to any conventional solder composition, to produce the test head of the invention. However, such spheres or balls are preferably incorporated in solder compositions of the type described in detail below. Alternatively, brass, bronze or copper flakes, and of substantially the same size as the spheres, can be employed.

There is accordingly provided, according to the invention, a solder composition, especially adapted for providing probes for testing high density circuits, which comprises a liquid vehicle, finely divided solder metal dispersed in said vehicle, said solder metal having particle size ranging from 40 to 70 microns, and additional metal particles dispersed in said vehicle, said additional metal particles being in the form of metal balls or flakes selected from the group consisting of brass, bronze and copper, said balls or flakes having a size ranging from about 5 to about 30 mils and being present in an amount ranging from about 5 to about 60% by weight of the total composition.

The solder cream containing the large metal particles, e.g., balls, is then applied to the test head by screening the solder composition onto pads on the test head, and the test head is then placed in a zone of high temperature which melts or fuses the solder onto the test head pads, leaving the large metal particles, e.g., spheres, protruding from the solder cream on such pads.

When such metal particles, e.g., balls, are thus attached to the test head, as previously noted, the test head is placed over the circuit to be tested and by application of pressure to the test head, the metal balls make contact with the appropriate test points of the circuit undergoing test. Contact is now provided from the circuit which is under test through the test head and out to the computer which is programmed to test the boards or circuits undergoing test.

These and other objects and features of the invention will become apparent from the following detailed description thereof.

DETAILED DESCRIPTION OF THE INVENTION AND PREFERRED EMBODIMENTS

This invention will be more clearly understood by reference to the description below, taken in connection with the accompanying drawings wherein:

FIG. 2 is a sectional view of an illustrative assembly of the test head of FIG. 1 placed over a test board containing a circuit to be tested, with the contacts formed by the metal balls and soldered to the test head, in physical contact with test points of the circuit on the test board, according to the invention;

FIG. 3 is an enlarged sectional view showing the metal balls soldered to a metal pad on the test head; and FIG. 4 is a schematic and diagrammatic view illustrating one method of manufacture of a solder cream employed in conjunction with large metal balls incorporated therein, used to form the test head assembly of FIG. 2.

Figure 1:
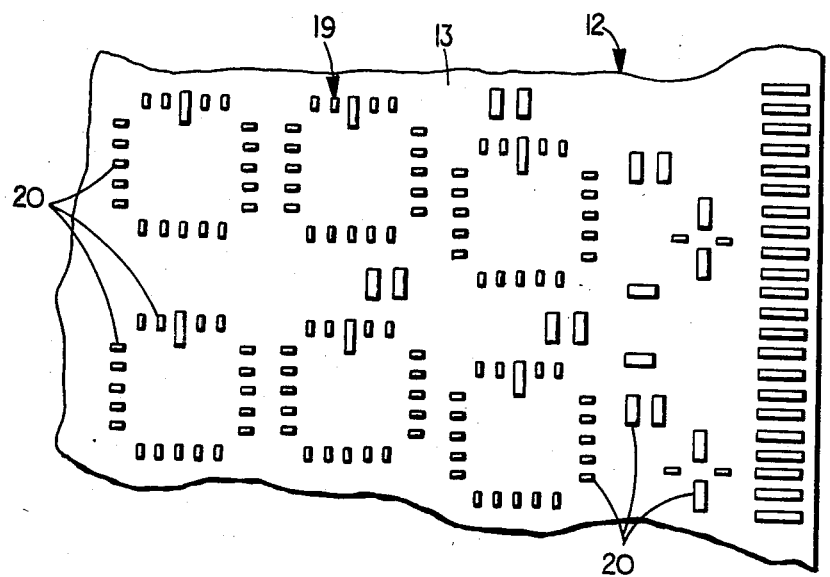
FIG. 1 is a plan view of a typical high density circuit on a test head membrane according to the invention.

Referring to FIGS. 1 and 2 of the drawings, numeral 10 represents a test board having thereon a high density circuit designated 11 to be tested to insure that it has all the correct interconnections before electronic components are placed thereon. A typical circuit for this purpose can be, for example, a high density multilayer thick film circuit or a multilayer circuit board, such as a computer memory circuit.

According to the present invention, a test head indicated at 12 is provided in the form of a translucent membrane 13 which has on one side, that is the lower side, thereof an electronic circuit indicated at 19, as seen in FIG. 1, which is a mirror image of the circuit 11 on the test board. Circuit 19 can be a multilayer circuit board. Conductors 14 provide electrical interconnection from circuit 19 on the test head through a connector 15 to a tester device such as a programmed computer (not shown) which is programmed to test the circuit 11 on the test board 10.

At every test point of the circuit 19 on the test head 12, there is a small metal pad 20 mounted on the test head membrane with an interconnection or via at 16 from each pad 20 to a conductor 14. Contacts 18 in the form of metal spheres (see also FIG. 3) are fused by means of a solder composition indicated at 22, to the test pads or test points 20 of circuit 19. The test pads 20 for such high density circuits can be relatively small, e.g., of the order of about 10 mils square, and the metal spheres, e.g., brass balls, forming the contacts 18 can be of substantially the same size as the width of such pads, e.g., about 10 mils in diameter, or smaller, depending on pad size.

Although in FIG. 2, only a single ball contact 18 is shown soldered to each pad 20, as illustrated in FIG. 3, several of such ball contacts can be soldered to a single pad, depending on the size of the pads and of the ball contacts.

A typical solder cream for fusing the metal balls or contacts 18 to the pads 20 on test head 12 is comprised of a liquid vehicle containing a viscosity controlling agent and a flux, and finely divided solder metal dispersed in such vehicle, as described below.

The vehicle for the solder metals of the solder cream or composition of the invention is a liquid composition having desirable viscosity characteristics and which maintains the solder metals in suspension without settling of the fine solder metal particles. Such vehicle can include viscosity controlling agents, organic solvents, a flux such as rosin, or derivatives thereof, or paraffin wax, and other components such as organic amines.

Thus, one component of the vehicle is a compound which increases the viscosity of the vehicle to the desired consistency, such as a thixotropic agent, and which can also function as a suspension medium to prevent settling of the solder particles. The amount of thixotropic agent is within the range 0.5–10%. Any thixotropic agent can be used, provided that it does not leave a residue insoluble in organic solvents (e.g., trichloroethylene) on the solder metal, after the firing operation. Common thixotropic agents are disclosed by Eirich, "Rheology," Academic Press, New York, 1967, Vol. 4, page 457. A preferred thixotropic agent is hydrogenated castor oil (Baker Castor Oil Co.). "Thixatrol" and Carboxy Methyl cellulose also can be used.

The second component of the vehicle is an organic solvent which provides the proper consistency for the vehicle. Such organic solvent is present in the range of 30 to 60%, by weight of the vehicle. Any of the common organic solvents, preferably non-chlorinated, may be used for this purpose, such as ketones, e.g., acetone, methyl ethyl ketone, methyl isobutyl ketone, and the like, esters such as alkyl acetates, mineral spirits, the terpenes (e.g., beta-terpineol), ethylene glycol, glycerol, aromatic hydrocarbons such as benzene, toluene, xylene, and phenol, and mixtures thereof. Preferably a solvent such as 2-butoxy (ethyl) ethyl acetate, 2-butoxy ethyl acetate, ethylene glycol or beta-terpineol, is used.

The third component of the vehicles is a flux. Various types of fluxes can be employed. Thus, one suitable flux is a rosin type flux, that is rosin orderivatives thereof. Rosin, the non-steam volatile fraction of pine oleoresin, is a mixture of five isomeric diterpene acids, the most abundant component being abietic acid. The terminology "rosin and derivatives thereof" includes rosin derived from gum, wood or tall oil, the acids in rosin such as abietic acid, and any of their derivatives, such as "Staybelite," "Poly-Pale," "Dimerex," "Vinsol," etc. The amount of flux present in the vehicle can range from 20–65%, preferably 30–60%, by weight of the vehicle.

Other organic materials can be employed as flux, such as petrolatum, rosin mixed with waxy or fatty material, long chain organic acids such as adipic acid, tars, and particularly paraffin waxes.

Also, the flux can be a water-soluble material such as an aqueous solution of sorbitol.

A flux also can comprise inorganic material such as, for example, borax, alkali metal fluoborates, and the like.

Other components such as amine hydrochlorides, e.g., propylamine hydrochloride, hydroxyl substituted aliphatic amines, and aliphatic amines such as isopropyl amine, can be present, e.g., to remove surface oxides of the solder metals. These materials can be present in amounts ranging from 0.01 to 10% by weight of the vehicle.

The solder compositions of the invention contain finely divided solder metal particles dispersed in the vehicle. The solder metals can be any of the conventional single or multiphase metals normally used for soldering, particularly tin, lead and silver, and alloys and mixtures thereof. Alloys or mixtures of tin-lead, tin-lead-silver, tin-silver and lead-silver, for example, can be employed. A preferred mixture of solder metals employed in the solder composition of the invention consists essentially of a mixture of lead, tin and silver, which can contain from 61.5 to 62.5% tin, 1.75 to 2.25% silver, and the balance lead. A particularly preferred solder metal mixture consists of 36% lead, 62% tin and 2% silver. The solder metal particles should be finely divided, and can have a particle size ranging from 40 to 70 micron size.

The solder compositions of the invention are prepared by admixing the solder metals and the vehicle including flux in certain proportions, as noted below.

According to the invention, relatively large metal balls or spheres of high melting metals or alloys are incorporated in the solder composition to form the metal contacts 18 on the test head 12. Such relatively large round metal balls or particles are preferably brass, bronze or copper balls, particularly brass balls, and of a size which can range from about 5 to about 30 mils, and which are substantially larger than the above noted 40 to 70 micron particle size of the solder metal particles. The proportion of such relatively large metal balls added to the solder composition ranges from about 5 to about 60% by weight of the total composition. Such metal balls can be of a size approximating the width of the metal pads 20 to which they are fused by the solder composition, or they can be of a size smaller or substantially smaller than the width of such pads.

It has also been found that particles of brass, bronze or copper, in the form of flakes rather than balls, can be used. Such flakes are of substantially the same size as the balls, that is, about 5 to about 30 mils, and are employed in the same proportions as the balls, i.e., about 5 to about 60% by weight of the total composition.

The solder compositions of the invention are prepared by admixing the large metal particles, e.g., brass, bronze or copper balls, with the solder cream containing fine particle size solder metal particles and vehicle including flux, in certain desired proportions as noted above. The preferred solder formulation or solder cream contains 10 to 14%, and optimally 13.5%, of vehicle containing flux, and 86 to 90%, optimally 86.5%, of solder metal, e.g., a mixture of very small particles of 40 to 70 micron size, of lead, silver and tin, by weight of total vehicle and solder metal. To this mixture is added about 5 to about 60%, preferably about 5 to about 35%, of brass, bronze or copper balls, by weight of the total composition, to provide an effective solder composition for purposes of the invention.

Although the above described solder formulations are preferred, other solder formulations, e.g., containing different proportions of solder metals and vehicle can be employed, to which the large metal particles, e.g., brass balls, are added in the proportions by weight noted above.

The solder composition of the invention is applied to metal pads 20 on the test head 12 to form the contacts 18 on the test head. Such metal pads can be of the order of 10-15 mil square, or even smaller. For this purpose the solder composition can contain particulate brass, bronze, or copper balls, e.g., in the form of balls of 5-15 mils diameter, in conjunction with solder metals such as a mixture of lead and tin of 40 to 70 micron size, in a solder vehicle. The application of the fluid solder composition containing the large metal balls or flakes, to the metal pads 20 of the test head can be made by use of metal screening. However, other modes of applying the solder composition in addition to screen printing, can be employed, including, for example, by means of a syringe-type dispenser.

Following application of the invention solder composition containing the large metal balls or flakes, to the pads 20, the circuit board containing the pads and the solder composition is placed in a vapor reflow system and heated by means of the vapor therein, to a temperature sufficient to cause melting of the solder composition, e.g., at temperature of between about 175° and 190° C. However, as illustrated in FIG. 3, since the large brass, bronze or copper balls present in the solder composition have a melting point substantially higher than 200° C. and maintain their shape and integrity, after the vapor reflow operation and fusion of the solder composition, the brass, bronze or copper balls embedded in the fused solder composition 22 which in turn is attached to the metal pads 20, protrude from the solder composition 22 and form the contacts or probes 18 on the test head 12. As previously noted, and referring again to FIG. 2, when the test head 12 containing the ball contacts 18 is placed over and aligned with the test board 10 containing the circuit 11 thereon to be tested, with the test points 20 of circuit 19 in alignment with the appropriate test points indicated at 21 of circuit 11, pressure is applied to the test head to force the contacts or probes 18 into contact with the oppositely aligned test points 21 of the circuit 11 on the test board 10, for testing, for example, a high density multilayer circuit, e.g.. a multilayer circuit board or a thick film circuit, for continuity and isolation prior to assembly thereof.

The following table shows examples of soldering compositions according to the invention.

TABLE

| | COMPOSITIONS | | | | | | |
|---|---|---|---|---|---|---|---|
| | A | B | C | D | E | F | G |
| Solder cream | | | | | | | |
| Vehicle (Parts by weight) | 13.5 | 13.0 | 14.0 | 13.2 | 12 | 11 | 11.5 |
| Comp. of vehicle - % by wt. | | | | | | | |
| Abietic acid | 59 | — | 59 | 50 | — | — | 35 |
| Paraffin wax | — | 59 | — | — | 50 | — | — |
| 2-Butoxy (ethyl) ethyl acetate | 31 | 31 | 31 | 40 | — | 50 | 55 |
| Hydrogenated castor oil | 8 | 8 | 8 | 7 | 7 | 6 | 7 |
| Isopropyl amine | 2 | 2 | 2 | 3 | 3 | 4 | 3 |
| Ethylene glycol | — | — | — | — | 40 | 40 | — |
| Solder metal (Parts by weight) | 86.5 | 87 | 86 | 86.8 | 88 | 89 | 88.5 |
| Comp. of solder metal (40–70 micron size) - % by wt. | | | | | | | |
| Lead | 36 | 36 | 36 | 40 | 37 | 4 | 36 |
| Tin | 62 | 62 | 62 | 60 | 63 | 96 | 62 |
| Silver | 2 | 2 | 2 | — | — | — | 2 |
| Metal Balls (percent by weight of total composition) | | | | | | | |
| Brass balls (5–10 mil) | 22 | 25 | 40 | | | | |
| Copper balls (10 mil) | | | | 60 | 30 | | |
| Bronze balls (20 mil) | | | | | | 10 | 15 |

FIG. 4 illustrates one means for making the solder cream of the invention. With reference to FIG. 4 the present solder cream may be manufactured using an apparatus similar to that illustrated therein. A socalled dry box 50 may be employed in which is deposited a quantity of the vehicle and flux 51. The metallic component of the solder cream may be in the form of a wire 52 dispensed from a supply 53 into a cutter, shaver or grinder, illustrated at 54, to reduce the metal to small particles. The box 50 is maintained with an inert atmosphere of nitrogen or the like, supplied from a source 55 through conduits 56 and 57 and a pump 58. The conduit 56 communicates with the interior of the box 50, there being a small bleed orifice 60 in order to maintain the atmosphere. The box may also be provided with a cover 61 for access thereto.

The conduit 57 extends to a nozzle 62 which receives the small metallic particles from the cutter 54. These particles travel through the interior of the nozzle 62 and, by contact therewith, are reduced to substantially round, minute particles. As noted in FIG. 4 of the drawings, nozzle 62 has internal ribs 63' which cause the particles to spiral therein in an ever-reducing spiral path, as illustrated by the arrow 65', thus creating the round nature of the particles. The metal particles, being round, can be used more efficiently in the silk screening operation, when applying the solder cream to a substrate. The metallic particles leave the nozzle 62 and are blown onto a suitable fine-mesh screen 63 of a size smaller than the size of the desired particles. Thereafter the metallic particles travel onto a screen 64, having a mesh to permit travel therethrough of the metallic particles of the desired size. Particles larger than the desired size may be collected by a tray 65 with the fine particles being collected by a tray 66. The desired size particles, as at 67, are dispensed from the screen 64 onto a tray 68, the weight thereof, as determined by a counterbalance 70, serving to deliver the particles into the vehicle or flux 51. Thereafter, the particles 67 are mixed with the vehicle 51 by means of a mixer 71 driven by a suitable power source 72.

While FIG. 4 illustrates one method of combining the desired size metallic particles with the vehicle to produce the solder cream, in practice, other similar methods may be used and several additional screening steps may be employed to insure the desired size of the metallic material. This operation is carried out within an inert nitrogen, or the like, atmosphere, substantially to eliminate oxidation of the metallic particles and to produce a solder cream substantially free of oxides which tend to inhibit attachment to the pads on the test head 12, and to eliminate contaminated solder joints.

The large metal particles, e.g. brass balls, in suitable proportions noted above are then added to the solder composition and mixed therewith in a mixer apparatus in an inert, e.g. nitrogen atmosphere, to produce a homogeneous mixture.

The following are some specific examples of further practice of the invention:

EXAMPLE I

In producing solder composition A of the above Table, a lead-tin-silver metallic mixture in the proportions of 36% lead, 62% tin and 2% silver, is formed into a very finely divided powder which is substantially free of oxides. The particle size of the metal mixture is between 40 and 70 microns.

The metallic powder is blown into a chamber, the metal balls are screened so that the particle size thereof is between 40 and 70 microns, and the particles are then mixed with the vehicle, such operations being carried out in an inert atmosphere, e.g., of nitrogen, to eliminate oxidation of the metals, as described in detail above and illustrated in FIG. 4. In this example, the flux-containing vehicle and metal mixture were combined in a percentage of 13.5% of the flux-containing vehicle and 86.5% of the metallic mixture, by weight. The viscosity of the resulting flux composition or cream was 500,000±10% centipoises at 20° C.

Brass balls of 10 mil diameter and in a proportion of 22% by weight of the total composition were then added to the solder composition and such balls were homogeneously mixed into the composition in a nitrogen atmosphere.

A screen was placed over a test head in the form of a translucent membrane having metal pads on one surface thereof at the test points on a mirror image circuit of a high density multilayer thick film circuit to be tested. The above solder composition containing brass balls was screened onto the pads on the test head. The test head with the solder composition on the pads was placed in a vapor phase system and subjected to a temperature of 215° C. Since the metal mixture of lead, tin and silver employed as solder metals has a melting range between 177° C. and about 189° C., the system temperature melted such metal particles in the solder composition and fused the large brass balls or contacts to the pads on the test head, leaving such balls or contacts securely positioned in place and soldered to the pads on the test head.

The resulting test head was placed over a test board containing the high density multilayer thick film circuit to be tested and pressure was applied to force the metal balls into contact with the test points of the circuit on the test board, to test such circuit, as illustrated in FIG. 2, and described above.

EXAMPLE II

The procedure of Example I for producing a test head according to the invention is followed, employing respectively, solder compositions B through G of the above table.

Substantially the same results are obtained, namely, soldering of the large brass, bronze or copper balls to the pads formed on the test head.

EXAMPLE III

The procedure of Example I is followed for producing a test head according to the invention, utilizing solder composition A, but substituting brass flakes of 5-10 mil size for the brass balls of composition A.

Substantially the same results are obtained, namely, soldering of the brass flakes to the pads formed on the test head.

From the foregoing, it is seen that the invention provides a novel solder composition comprised of essentially conventional components including vehicle containing flux, together with fine particle size solder metals, but which incorporates infusible relatively large particles in the form of brass, bronze or copper balls, or flakes, and which when applied to a suitable test head containing a testing circuit is capable of providing a novel test head arrangement wherein the large size particles, e.g. brass balls, provide the contact points between the circuitry on the test head and the points of a circuit to be tested on a test board. The present invention permits the testing of continuity and isolation of high density circuits without the use of spring-loaded probes.

Although the solder composition of the invention is particularly applicable for use in providing probes or contact points on a test head for testing an electronic circuit on a test board, such solder composition is also useful in other applications, e.g., for spacing surface mounted components in electronic circuitry.

While particular embodiments of the invention have been described for purposes of illustration, it will be understood that various changes and modifications within the spirit of the invention can be made, and the invention is not to be taken as limited except by the scope of the appended claims.

What is claimed is:

1. A solder composition which comprises a liquid vehicle, said liquid vehicle containing a viscosity controlling agent and a flux, finely divided solder metal dispersed in said vehicle, said solder metal having a particle size ranging from 40 to 70 microns, said liquid vehicle being present in an amount of 10 to 14%, and said solder metal being present in an amount of 86 to 90%, by weight of total vehicle and solder metal in said composition, and additional metal particles dispersed in said vehicle, said additional particles being in the form of metal balls or flakes selected from the group consisting of brass, bronze and copper, said additional metal particles having a size ranging from about 5 to about 30 mils and being present in an amount ranging from about 5 to about 60% by weight of the total composition.

2. The composition of claim 1, said flux being a rosin type flux or a paraffin wax.

3. The composition of claim 2, said flux being a rosin type flux or a paraffin wax.

4. The composition of claim 1, said solder metal being selected from the group consisting of tin, lead and silver, and alloys and mixtures thereof.

5. The composition of claim 4, said solder metal being alloys or mixtures of tin, lead and silver; tin and lead; tin and silver; and lead and silver.

6. The composition of claim 4, said thixotropic agent (a) being hydrogenated castor oil or carboxy methyl cellulose, said organic solvent (b) being 2-butoxy (ethyl) ethyl acetate, 2-butoxy ethyl acetate, ethylene glycol or beta-terpineol, and said flux (c) comprising abietic acid or a paraffin wax.

7. The composition of claim 4, wherein said vehicle consists of 0.5–10% of (a), 30–60% (b) and 20–65% of (c) by weight.

8. The composition of claim 4, said thixotropic agent (a) being hydrogenated castor oil, said organic solvent (b) being 2-butoxy (ethyl) ethyl acetate, and said flux (c) comprising abietic acid.

9. The composition of claim 4, said solder metal being an alloy of 62% tin, 2% silver and 36% lead.

10. The composition of claim 1, said additional metal particles being brass balls present in an amount of about 5 to about 35% by weight of the total composition.

11. A solder composition which comprises a liquid vehicle, said liquid vehicle containing (a) a thixotropic agent, (b) an organic solvent and (c) a flux, finely divided solder metal dispersed in said vehicle, said solder metal having a particle size ranging from 40 to 70 microns, said liquid vehicle being present in an amount of 10 to 14%, and said solder metal being present in an amount of 86 to 90%, by weight of total vehicle and solder metal in said composition, and additional metal particles dispersed in said vehicle, said additional particles being in the form of metal balls or flakes selected from the group consisting of brass, bronze and copper, said additional metal particles having a size ranging from about 5 to about 30 mils and being present in an amount ranging from about 5 to about 60% by weight of the total composition.

* * * * *